United States Patent
Hsu et al.

(10) Patent No.: US 9,250,619 B2
(45) Date of Patent: Feb. 2, 2016

(54) SYSTEMS AND METHODS OF AUTOMATIC BOUNDARY CONTROL FOR SEMICONDUCTOR PROCESSES

(75) Inventors: Chih-Wei Hsu, Chuang-Hua (TW); Mei-Jen Wu, Hsin-Chu (TW); Yen-Di Tsen, Chung-Ho (TW); Jo Fei Wang, Hsin-Chu (TW); Jong-I Mou, Hsinpu Township, Hsinchu County (TW); Chin-Hsiang Lin, Hsin-chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1092 days.

(21) Appl. No.: 13/311,601

(22) Filed: Dec. 6, 2011

(65) Prior Publication Data
US 2013/0144423 A1 Jun. 6, 2013

(51) Int. Cl.
G06F 19/00 (2011.01)
G05B 19/18 (2006.01)
H01L 21/66 (2006.01)

(52) U.S. Cl.
CPC ............... G05B 19/18 (2013.01); H01L 22/20 (2013.01); *G05B 2219/45031* (2013.01)

(58) Field of Classification Search
CPC ............. H01L 22/20; H01L 21/67276; G05B 19/41865; G05B 19/41875
USPC ........................................................ 700/121
See application file for complete search history.

(56) References Cited

U.S. PATENT DOCUMENTS

| 4,425,408 | A | 1/1984 | Levine et al. |
| 7,974,723 | B2 | 7/2011 | Moyne et al. |
| 8,266,567 | B2 | 9/2012 | El Yahyaoui et al. |
| 8,532,839 | B2 * | 9/2013 | Drees et al. ................ 700/305 |
| 2007/0020782 | A1 * | 1/2007 | Rathei ............................ 438/14 |
| 2008/0275585 | A1 * | 11/2008 | Lin et al. ..................... 700/109 |

FOREIGN PATENT DOCUMENTS

| CN | 101238421 A | 8/2008 |
| CN | 101720463 A | 6/2010 |
| CN | 101965569 A | 2/2011 |
| TW | 200415453 | 8/2004 |
| TW | 201001162 | 1/2010 |
| WO | 2007008538 A2 | 1/2007 |

OTHER PUBLICATIONS

Official Action issued Dec. 27, 2014 in counterpart TW patent application.

* cited by examiner

Primary Examiner — Carlos Ortiz Rodriguez
Assistant Examiner — Chad Rapp
(74) Attorney, Agent, or Firm — Duane Morris LLP

(57) ABSTRACT

A system and method of automatically calculating boundaries for a semiconductor fabrication process. The method includes selecting a first parameter for monitoring during a semiconductor fabrication process. A first set of values for the first parameter are received and a group value of the first set is determined. Each value in the first set of values is normalized. A first weighting factor is selected based on a number of values in the first set. The embodiment also includes generating a first and a second boundary value as a function of the weighting factor, the first set normalized values and the group value of the first set and applying the first and second boundary values to control the semiconductor fabrication process.

20 Claims, 6 Drawing Sheets

SYSTEMS AND METHODS OF AUTOMATIC BOUNDARY CONTROL FOR SEMICONDUCTOR PROCESSES

FIELD OF THE INVENTION

The present disclosure is directed generally to semiconductor processes and more particularly to systems.

DESCRIPTION OF THE RELATED ART

Integrated circuits are produced by a plurality of semiconductor processes in a wafer fabrication facility. These processes, and associated fabrication tools, may include thermal oxidation, diffusion, ion implantation, rapid thermal processing (RTP), chemical vapor deposition (CVD), physical vapor deposition (PVD), epitaxy formation/growth processes, etch processes, photolithography processes, and/or other fabrication processes and tools. In addition, the fabrication process includes a plurality of metrology processes for monitoring and control of the integrated circuit fabrication yield, quality and reliability.

In-line semiconductor production processes generate a vast quantity of data during the production of integrated circuits. These processes also involve monitoring system parameters and controlling boundary settings for such parameters using predetermined boundaries. The boundaries may be set too wide, or lack synchrony. As a result, foundries face significant costs.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EXAMPLES

Figure 1:
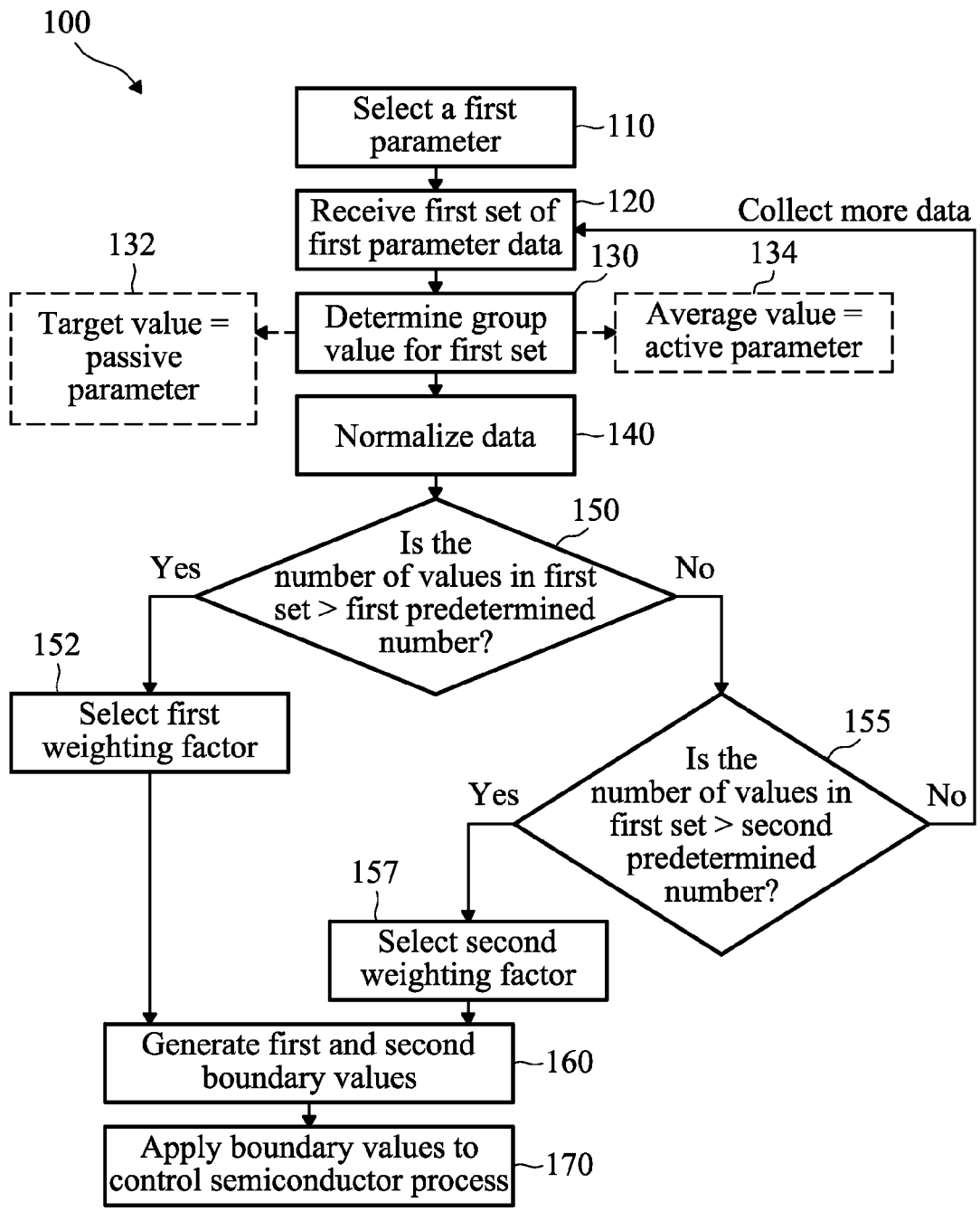
FIG. 1 is a flow chart illustrating a method of automatically calculating boundaries for a semiconductor fabrication process according to embodiments of the present disclosure.

Improved systems and methods of boundary control for system parameters in semiconductor processes are provided. The automatic boundary control systems (ABS) and processes described herein are not limited to any specific semiconductor process technology, production area, equipment, technology node, fabrication tool, wafer size, etc. The inventors have developed an automatic method and system of boundary control that is capable of processing large amounts of data from monitoring semiconductor processes and forming tailor-made boundaries for selected parameters in selected elements of the semiconductor process to improve quality control and decrease costs.

The inventors have determined that by monitoring data sets for selected parameters and tailoring boundary values to these monitored data sets, improved overall quality control and abnormality detection can be achieved. As more data are received into the ABS for a parameter, the boundary values will continue to be refined and the accuracy of the system will continue to improve. The ABS provides the functionality to monitor trends and behavior in active and passive parameters and the functionality to detect abnormalities and respond efficiently and accurately to adjust process windows for semiconductor fabrication processes. In some embodiments, the ABS provides the functionality to further monitor data sets for selected parameters in selected system elements (e.g., components, machines, subsystems and systems and/or devices) and further tailor boundary values to these monitored data sets. The ABS minimizes the human resource requirements to maintain the high volume and complicated data processing as the system is highly automated. However, in alternative embodiments, the ABS may include various stages for human interaction, observation and interface if desired.

With reference to the Figures, where like elements have been given like numerical designations to facilitate an understanding of the drawings, the various embodiments of a multigate semiconductor device and methods of forming the same are described. The figures are not drawn to scale.

The following description is provided as an enabling teaching of a representative set of examples. Those skilled in the art will recognize that many changes can be made to the embodiments described herein while still obtaining beneficial results. It will also be apparent that some of the desired benefits discussed below can be obtained by selecting some of the features or steps discussed herein without utilizing other features or steps. Accordingly, those who work in the art will recognize that many modifications and adaptations, as well as subsets of the features and steps described herein are possible and may even be desirable in certain circumstances. Thus, the following description is provided as illustrative and is not limiting.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present invention. Moreover, various features and benefits are illustrated by reference to the exemplary embodiments. Accordingly, the subject matter of this disclosure and the appended claims are expressly not limited to such preferred embodiments.

As used herein, use of a singular article such as "a," "an" and "the" is not intended to exclude pluralities of the article's object unless the context clearly and unambiguously dictates otherwise.

FIG. 1 is a flow chart illustrating a method 100 of automatically calculating boundaries for a semiconductor fabrication process. At block 110, a first parameter is selected for monitoring during a semiconductor process. In some embodiments, the first parameter may be a device parameter including, for example, an electrical or physical parameter such as a change in saturation current, a leakage parameter, a speed parameter, and/or any other suitable device parameter. In other embodiments, the first parameter may be a process parameter. A process parameter may include equipment parameters or metrology parameters associated with a semiconductor process. For example, the value of a process parameter may be observed through monitoring and determined during fabrication (e.g., in-line). The values associated with a process parameter may be referred to herein as process data. A process parameter may be an active parameter or a passive parameter. An active (or actively controlled) parameter may include any process parameter that can be easily specified during a particular semiconductor process (such as, by defining the parameter in an equipment recipe.) Examples of an active parameter include an RF power, a gas flow rate, a concentration, a trim time, a pressure, or a processing time. A passive parameter may include any fabrication parameter that is not determined by recipe but rather, for example, is a dependent variable inherent in a process based upon other passive and/or actively controlled parameters, a type of equipment, a condition of equipment, a condition of a wafer being processed, and/or other possible factors. Examples of a passive parameter include reflected power, ambient conditions, contaminate levels, and temperature and/or pressure profiles inherent in a fabrication tool. Further examples include critical dimension (CD) or depth for a polyetching process.

In some embodiments, the first parameter is selected for monitoring in an element. An element may include any suitable device, component, machine, subsystem, or system in which parameters may be monitored such as, for example, a part, a tool, a circuit or a process chamber. By way of example, in some embodiments, an element may be a process chamber and the selected first parameter may be a gas flow rate in the process chamber. Further by way of example, an element may be a circuit, and the selected first parameter may be a leakage parameter. In various embodiments, the first parameter is selected for monitoring in more than one element such as, for example, in more than one process chamber.

At block 120, a first set of values for the first parameter are received. In some embodiments, the first data set may be collected while monitoring the performance of a fabrication process. In some embodiments, the first set of values for the first parameter are received in an element such as, for example, a process chamber. At block 130, a group value of the first set of values for the first parameter is determined. In embodiments where the first parameter is an active parameter, the group value may be determined at block 132 using an arithmetic function of the first set of values. For example, the group value may be an average value of the first set of values. In embodiments where the first parameter is a passive parameter, the group value may be determined at block 134 as a target value for the first set of values. This target value may be a desired value, or an expected value, for the first parameter.

At block 140, each value in the first set of values is normalized. The values in the first set may be normalized using any suitable method of normalizing data. In some embodiments where the first parameter is an active parameter such that the group value is an average value, the values in the first set of values for the first parameter may be normalized by determining an offset, to zero the average value of the first set and by adjusting each value in the first set of values based on the offset. In various embodiments, the normalized data may be calculated by subtracting the group value from each value in the first set of values. In some embodiments, the values in the first set of data received in an element is normalized. By way of example, a first set of values for the first parameter in a machine, "A," may be received and a second set of values for the first parameter in a machine, "B," may be received. The first and second sets of values may have different group values. The values may be normalized in each respective set by subtracting the respective group value from each value in each respective set. In some embodiments, the standard deviation of the normalized values in the first set may be determined.

With reference to block 150, a weighting factor is selected based on a number of values in the first set. In some embodiments, the number of values in the first set may be compared to a first predetermined number. The first predetermined number may be selected prior to commencement of a monitored semiconductor process. As shown, if the number of values in the first set is greater than the first predetermined number, then a first weighting factor is selected at block 152. If the number of values in the first set is less than the first predetermined number, then the number of values in the first set may be compared to a second predetermined number at block 155. In other embodiments, if the number of values in the first set is less than the first predetermined number, then the logic may direct that more data in the first set be received. In some embodiments, if the number of values in the first set is greater than the second predetermined number, then a second weighting factor is selected at block 157. If the number of values in the first set is less than the second predetermined number, then more data in the first set may be received. For example, if the number of values in the first set is from 10 to 19, the first weighting factor may be 6, while if the number of values in the first sector is from 20- to 29, the first weighting factor may be 5, while if the number of values in the first set is at least 30, the first weighting factor may be 4.

At block 160, first and a second boundary values may be generated as a function of the weighting factor, the first set normalized values and the group value of the first set. As used herein, a boundary value is a value that is applied to control a semiconductor process. Boundary values establish the process window, i.e. the range of acceptable or stable values for a parameter for a semiconductor process. The inventors have observed that by tailoring boundary values to monitored data sets of a selected parameter, a large quantity of data may be processed, and improvements in overall quality control and abnormality detection can be achieved. The inventors have further observed that by tailoring separate boundary values to each of a plurality of individual elements, for example a part, or a tool, or a circuit or a process chamber, false alarms may be minimized and a higher percentage of element errors or abnormalities may be detected. In some embodiments, first and a second boundary values may be generated as a function of the weighting factor, a standard deviation of the first set normalized values, and the group value of the first set. In some embodiments, first and second boundary values may be computed using the algorithm:

$$\sigma_L = \sqrt{((\sigma_{L\_normalized})^2 + (\sigma_{element\_mean})^2)}.$$

In the above algorithm, $\sigma_L$ denotes an overall standard deviation for the first set of values, $\sigma_{L\_normalized}$ denotes the standard deviation of the first set of normalized values, $\sigma_{element\_mean}$ denotes the standard deviation of the group value in the element for the values in the first set. By way of example, if an active parameter, such as a gas flow rate, is selected for monitoring in a chamber, a first set of values for the active parameter are received in the chamber. An average value, such as a mean value, may be determined for the first set of values. Each of the values in the first set may be normalized. A $\sigma_{L\_normalized}$ value may be determined for the normalized values in the first set. A $\sigma_{chamber\_mean}$ value may be determined based on the average value of the first set for the chamber. An overall standard deviation may be determined for the first set based on the specified algorithm. In some embodiments, the first and second boundary values may be generated by multiplying the first weighting factor by the overall standard deviation for the first set of values and as a function of the result of the multiplying step and the average value of the first set. For example, the first and second boundary values may be generated using the function: $L_{-average} \pm (WF)^* \sigma_L$ where $L_{-average}$ denotes the average value of the first set, WF denotes the selected weighting factor, and $\sigma_L$ denotes an overall standard deviation for the first set of values. At block 170, the first and second boundary values are applied to control the semiconductor process. For example, the first boundary value may be applied to increase or decrease an upper boundary value established for a selected parameter in an element in a semiconductor process and the second boundary value may be applied to increase or decrease a lower boundary value established for the selected parameter in the element in the semiconductor process.

In some embodiments, the method can be implemented by a general purpose computer programmed in accordance with the principals discussed herein. The described embodiments, particularly any "preferred" embodiments, are merely possible examples of implementations, merely set forth for a clear understanding of the principles of the disclosure. Many variations and modifications may be made to the described embodiments of the disclosure without departing substantially from the spirit and principles of the disclosure. All such modifications and variations are intended to be included herein within the scope of this disclosure and the present disclosure and protected by the following claims.

Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Figure 2:
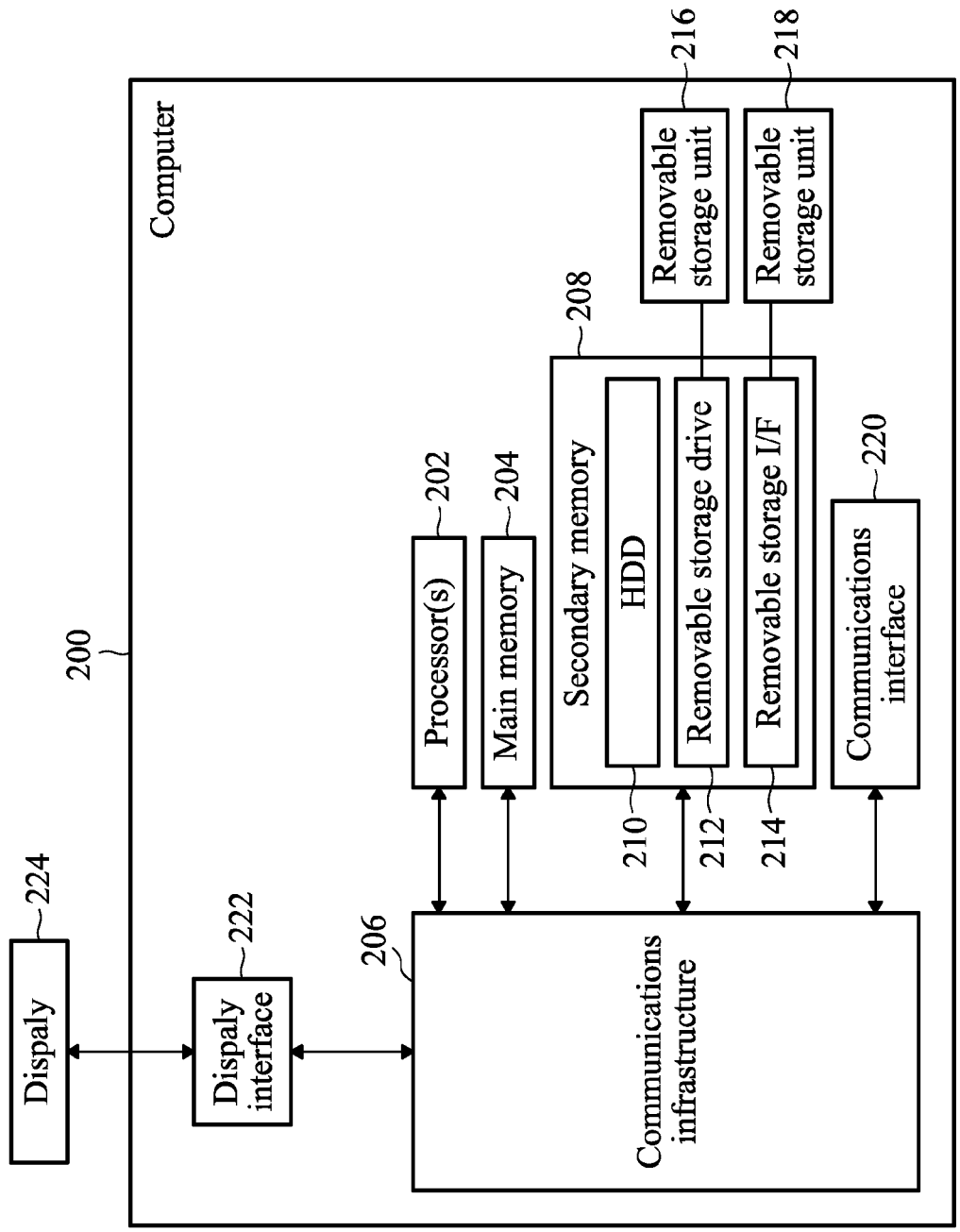
FIG. 2 is a diagram of an illustrative example of an architecture of a computer processing unit according to some embodiments.

A diagram of an illustrative example of an architecture of a computer processing unit according to some embodiments is shown in FIG. 2. Embodiments of the subject matter and the functional operations described in this specification can be implemented in electronic circuitry, or in computer firmware, or hardware, including the structures disclosed in this specification and their equivalents, or in combinations of one or more of them. Embodiments of the subject matter described in this specification can be implemented as one or more computer program products, i.e., one or more modules of computer program instructions encoded on a tangible machine readable storage medium for execution by, or to control the operation of, data processing apparatus. The tangible storage medium can be a computer readable medium. The computer readable medium can be a machine-readable storage device, a machine-readable storage substrate, a memory device, a hard disk drive, a tape drive, an optical drive (such as, but not limited to CDROM, DVD, or BDROM) or the like, or a combination of one or more of them. At least a portion of the automatic boundary system (ABS) may be implemented in a computer system 200 and specifically in software and presented to a user on a monitor or other display device. In various embodiments, the computer system 200 includes functionality providing for the ABS and processes as described, for example, in FIGS. 1, and 3-6.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. In some embodiments, information related to the ABS may be presented to a user as a graphical user interface (GUI) on a display device such as a computer monitor. For example, the display device may be operable to display, in human readable form, a process window for a parameter in an element, data received for a parameter in a plurality of elements, data received for a plurality of parameters in a plurality of elements, etc. Other kinds of devices can be used to provide for interaction with a user as well; for example, input from the user can be received in any form, including acoustic, speech, or tactile input.

FIG. 2 illustrates one example of an architecture of a computer system 200 configured to implement at least a portion of the ABS. As illustrated in FIG. 2, computer system 200 may include one or more processors 202. The processor 202 is connected to a communication infrastructure 206 (e.g., a communications bus, cross-over bar, or network). Computer system 200 may include a display interface 222 that forwards graphics, text, and other data from the communication infrastructure 206 (or from a frame buffer not shown) for display on the display unit 224.

Computer system 200 also includes a main memory 204, such as a random access memory (RAM), and a secondary memory 208. The secondary memory 208 may include, for example, a hard disk drive (HDD) 210 and/or removable storage drive 212, which may represent a floppy disk drive, a magnetic tape drive, an optical disk drive, or the like. The removable storage drive 212 reads from and/or writes to a removable storage unit 216. Removable storage unit 216 may be a floppy disk, magnetic tape, optical disk, or the like. As will be understood, the removable storage unit 216 may include a computer readable storage medium having stored therein computer software and/or data. Computer readable storage media suitable for storing computer program instructions and data include all forms data memory including non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM, DVD-ROM, and BDROM disks. The processor 202 and the memory 204 can be supplemented by, or incorporated in, special purpose logic circuitry.

In alternative embodiments, secondary memory 208 may include other similar devices for allowing computer programs or other instructions to be loaded into computer system 200. Secondary memory 208 may include a removable storage unit 218 and a corresponding interface 214. Examples of such removable storage units include, but are not limited to, USB or flash drives, which allow software and data to be transferred from the removable storage unit 218 to computer system 200.

Computer system 200 may also include a communications interface 220. Communications interface 220 allows software and data to be transferred between computer system 200 and external devices. Examples of communications interface 220 may include a modem, Ethernet card, wireless network card, a Personal Computer Memory Card International Association (PCMCIA) slot and card, or the like. Software and data transferred via communications interface 220 may be in the form of signals, which may be electronic, electromagnetic, optical, or the like that are capable of being received by communications interface 220. These signals may be provided to communications interface 220 via a communications path (e.g., channel), which may be implemented using wire, cable, fiber optics, a telephone line, a cellular link, a radio frequency (RF) link and other communication channels.

The computer program products provide software to computer system 200. Computer programs (also referred to as computer control logic) are stored in main memory 204 and/or secondary memory 208. Computer programs may also be received via communications interface 220. Such computer programs, when executed by a processor, enable the computer system 200 to perform the features of the method discussed herein. For example, main memory 204, secondary memory 408, or removable storage units 216 or 218 may be encoded with computer program code for performing the process shown in FIG. 1.

In an embodiment implemented using software, the software may be stored in a computer program product and loaded into computer system 200 using removable storage drive 212, hard drive 210, or communications interface 220. The software, when executed by a processor 202, causes the processor 202 to perform the functions of the methods described herein. In another embodiment, the method may be implemented primarily in hardware using, for example, hardware components such as a digital signal processor comprising application specific integrated circuits (ASICs). In yet another embodiment, the method is implemented using a combination of both hardware and software.

Various embodiments can be implemented in a computing system that includes a back end component, e.g., as a data server, or that includes a middleware component, e.g., an application server, or that includes a front end component, e.g., a computer having a graphical user interface or a Web browser through which a user can interact with an implementation of the subject matter described is this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

Figure 3:
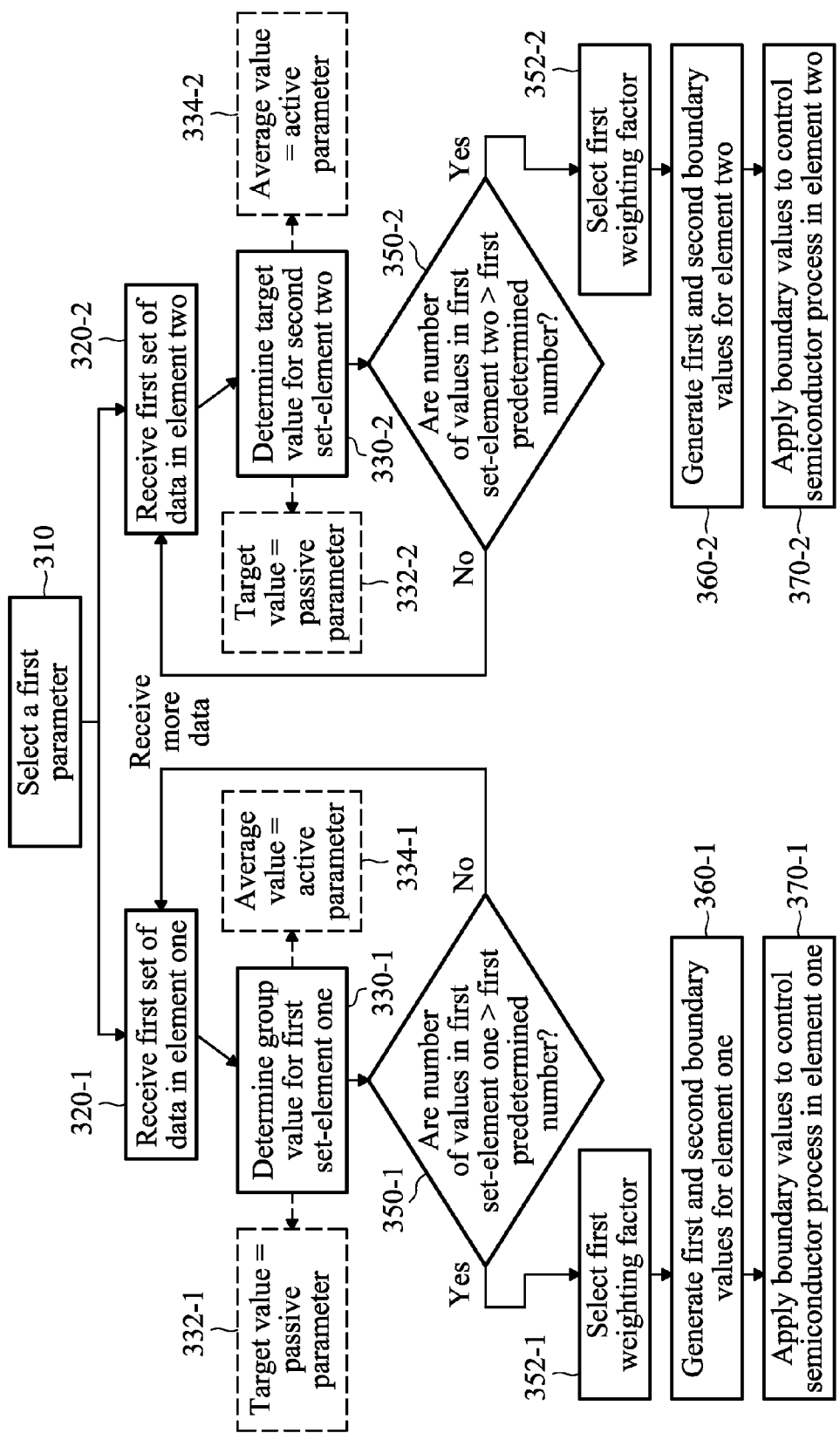
FIG. 3 is a flow chart illustrating a method of automatically calculating boundaries for a semiconductor fabrication process according to embodiments of the present disclosure.

FIG. 3 shows a flow chart of a method of automatically calculating boundaries for a semiconductor fabrication process. At block 310, a first parameter is selected as described above for FIG. 1. At blocks 320-1 and 320-2, a first set of data is received in elements one and two respectively as described above for block 120. Group values for the first sets of data in elements one and two are respectively determined at blocks 330-1 and 330-2. First weighting factors are selected based on a number of values in the first set in elements one and two respectively. For example, as shown in blocks 350-1 and 350-2, respective comparisons of the number of values in the first sets of elements one and two with a first predetermined number are performed as described above for block 150. If the comparisons indicate that the number of values in the respective first sets for elements one and two exceed the first predetermined number, then the first weighting factor is selected for computations for both data sets. If one or more of the comparisons indicate that the number of values in a respective set are less than the first predetermined number, then logic directs that more data be collected for the indicated data set. At blocks 360-1 and 360-2 first and second boundary values are generated for elements one and two respectively and the boundary values are applied to control the semiconductor process in each respective element at blocks 370-1 and 370-2.

Figure 4:
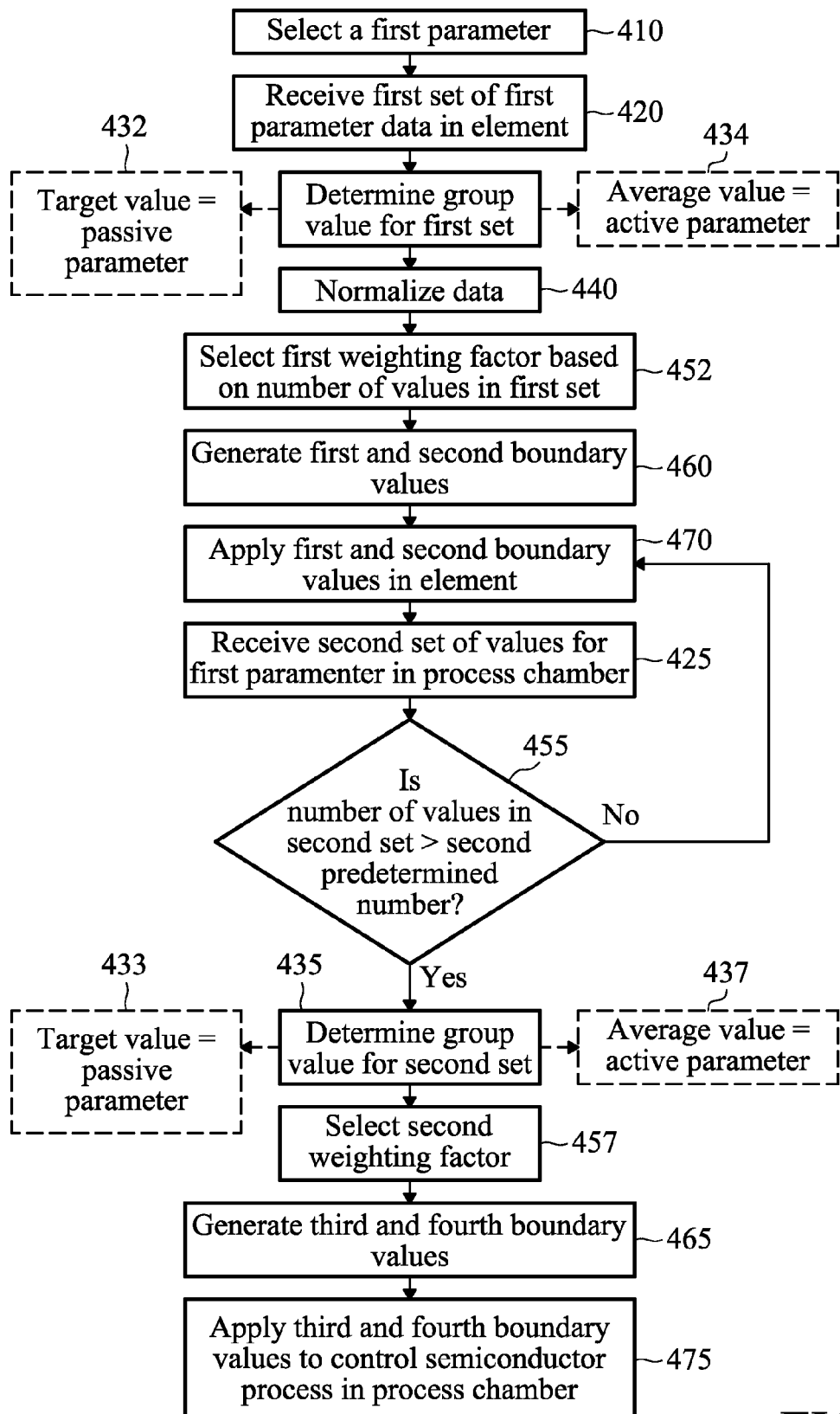
FIG. 4 is a flow chart illustrating a method of automatically calculating boundaries for a semiconductor fabrication process according to embodiments of the present disclosure.

With reference now to FIG. 4, a flow chart illustrating a method of automatically calculating boundaries for a semiconductor fabrication process is shown. Blocks 410 to 470 illustrate a method of generating first and second boundary values based on a received set of first parameter data that is substantially similar to that described above for blocks 110 to 170. In the illustrated embodiment, this process is performed for first parameter data received in an element. In some embodiments, this process is performed for first parameter data received in more than one element, such as a plurality of process chambers, until an appropriate amount of data is received for the first parameter in one element, or even a sub-element, such as one process chamber. At block 425, a second set of values for the first parameter are received in a process chamber. At blocks 455 and 457, a second weighting factor is selected based on the number of values in the second set. If an appropriate number of values in the second set is received, e.g. the number of values in the second set exceeds a second predetermined number, than the second weighting factor is selected at block 457. If the number of values in the second set is less than a second predetermined number, then the boundary values in the process chamber remain the same as shown in FIG. 4. At block 435, a group value of the second set is determined. In embodiments where the first parameter is an active parameter, the group value may be determined at block 433 using an arithmetic function, for example an averaging function, of the second set of data. In embodiments where the first parameter is a passive parameter, the group value may be determined at block 437 as a target value for the second set of values. At block 465, a third and a fourth boundary value are generated as a function of the second weighting factor, the second set of values and the group value of the second set. In some embodiments, a standard deviation of the second set of values for the first parameter in the process chamber is determined and the third and fourth boundary values are also generated as a function of the determined standard deviation. For example, the third and fourth boundary values may be generated using the function: $L_{-average} \pm (WF) * \sigma_L$ where $L_{-average}$ denotes the average value of the second set, WF denotes the selected weighting factor, and $\sigma_L$ denotes the standard deviation for the second set values. At block 475, the third and fourth boundary values are applied to control a semiconductor process in the process chamber.

Figure 5:
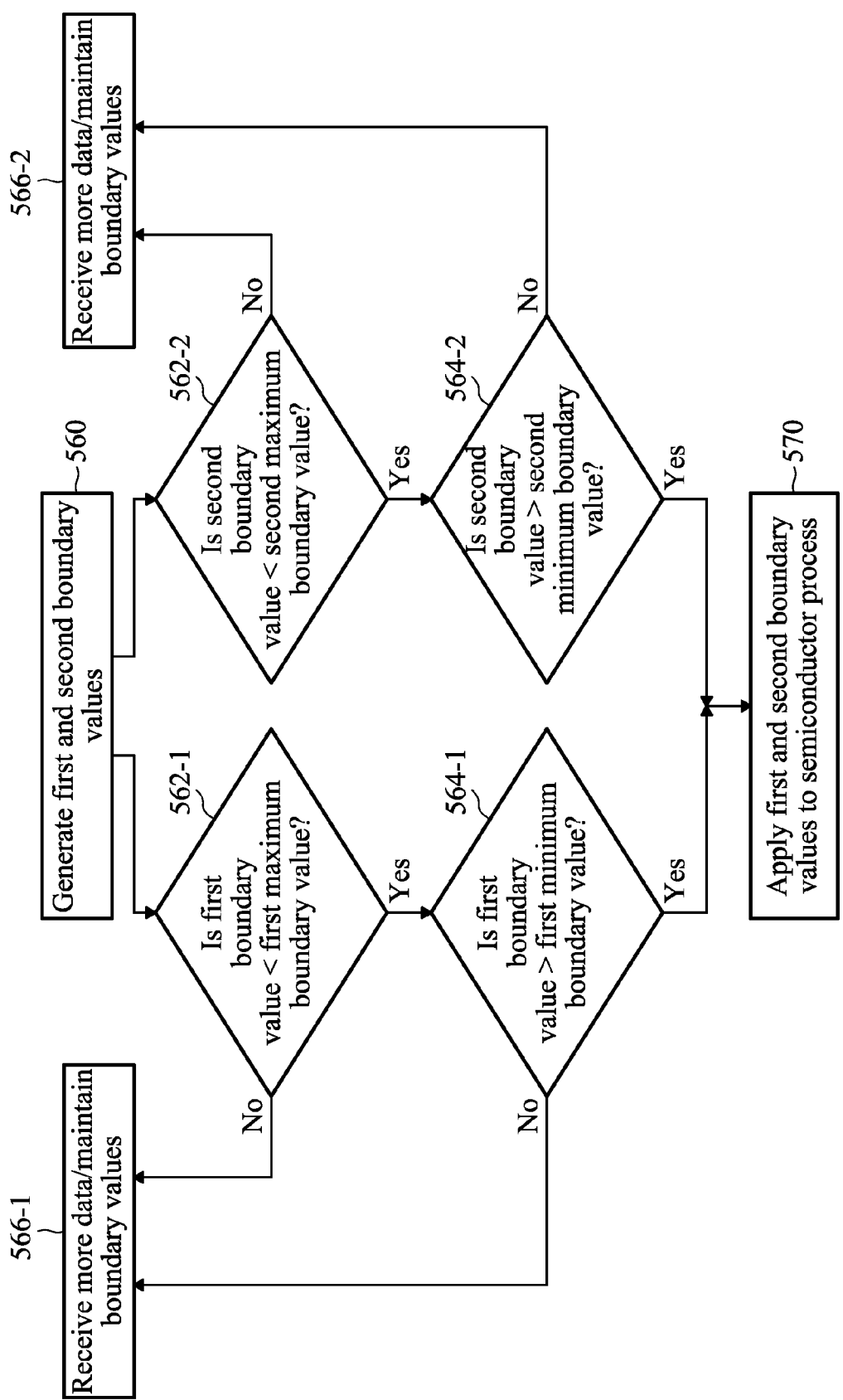
FIG. 5 is a flow chart illustrating a method of automatically calculating boundaries for a semiconductor fabrication process according to some embodiments.

FIG. 5 illustrates a flow chart for a method of automatically calculating boundaries for a semiconductor fabrication process according to some embodiments. A process window for boundary values may be further controlled by limits, for example stop points, that may be established by design engineers for each parameter being monitored. In some embodiments, design engineers may establish limits for each parameter in each element or plurality of elements being monitored. For example, these limits may be determined by design engineers during initial setup of the ABS or during an alignment or calibration stage of the ABS. The limits will maintain the process window for a parameter within a stable range to further avoid false alarms that may be generated by erroneous data received over time. At block 560, first and second boundary values may be generated as described herein. At blocks 562-1 and 562-2, the first and second boundary values may be respectively compared to first and second maximum boundary values. If either boundary value is greater than a respective maximum boundary value, logic in the ABS may require more data for the monitored parameter to be received. The process window for the monitored parameter may stay the same. At blocks 564-1 and 564-2, the first and second boundary values may be respectively compared to first and second minimum boundary values. If either boundary value is less than a respective minimum boundary value, logic in the ABS may require more data for the monitored parameter to be received. The process window for the monitored parameter may stay the same. On the other hand, if the first and second boundary values are determined to be within the control limits set within the ABS for the monitored parameter, then the first and second boundary values may be applied to control a semiconductor process. For example, if both the first and second boundary values are less than respective maximum boundary values and greater than respective minimum boundary values, then the first and second boundary values may be applied to control a semiconductor process. In various embodiments, a similar process may be performed for first and second boundary values generated based on data for a monitored parameter in a monitored element.

Figure 6:
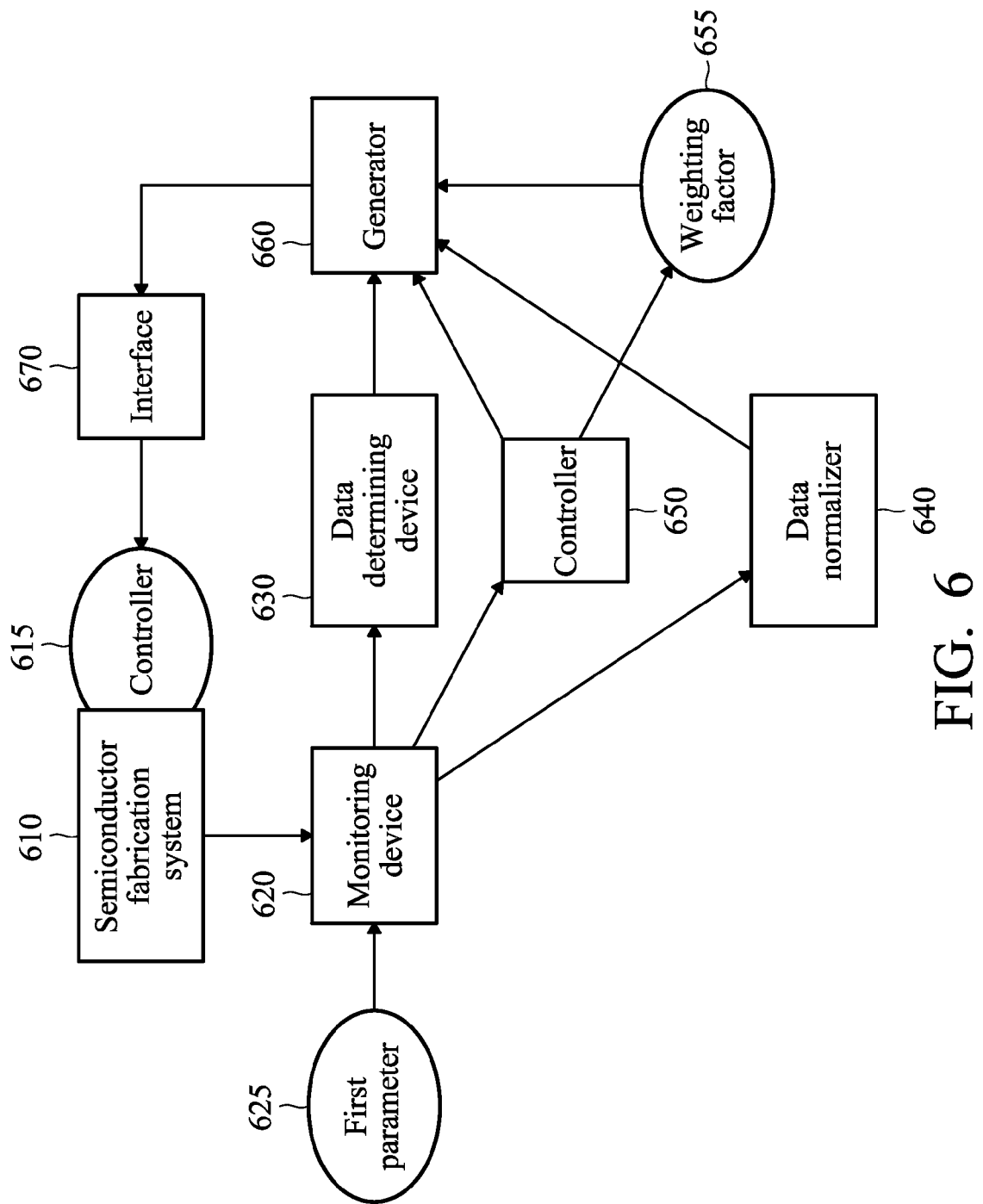
FIG. 6 is a an example of an automatic boundary system according to embodiments of the present disclosure.

Referring now to FIG. 6, an example of an automatic boundary system 600 according to embodiments of the present disclosure is shown. A monitoring device 620 is provided to monitor a selected first parameter. In some embodiments, the monitoring device 620 may be provided to monitor a selected parameter for a selected element, such as a part, a tool, a circuit or a process chamber. The ABS 600 may include a receiver (not shown) and/or a storage device (not shown) to receive and/or store data as the monitoring device 620 monitors the selected first parameter. The ABS 600 may include a data determining device 630 to determine a group value of a first set of values for the selected parameter. In some embodiments, the ABS 600 may include a data determining device (not shown) to determine a standard deviation of the first set of values for the selected parameter. The ABS may include a data normalizer 640 to normalize each value in the first set of values. In some embodiments, data determining device 630 may perform one or more of the determining and/or normalizing operations. A counter 650 may be provided to determine a number of values in the first set. Counter 650 may be used to determine a weighting factor based on the number of values in the first set. A selector (not shown) may further be used to select a weighting factor based on the output of counter 650. A generator 660 is provided generate a first and a second boundary value as a function of a selected first weighting factor from a weighting factor input 665, the first set normalized values output from the data normalizer 640 and the group value of the first set output from the data determining device 630. In some embodiments, generator 660 may also receive a standard deviation of the first set values input from data determining device 630 or a separate data determining device (not shown). The ABS 600 may include a trigger (not shown) to permit the system, or a user, for example, a process engineer, to trigger generator 660 to recalculate boundary values if the system, or user, determines that the boundary values require such recalculation. The ABS 600 may also include an interface 670 to apply the generated first and second boundary values to a controller 615 to control performance of a at least a portion of the semiconductor fabrication process within a semiconductor fabrication system 610. The interface 670 may update the boundaries or keep the boundaries the same for a process window for the parameter based on limits established for the ABS 600.

One embodiment provides a method of automatically calculating boundaries for a semiconductor fabrication process including selecting a first parameter for monitoring during a semiconductor fabrication process. A first set of values for the first parameter are received and a group value of the first set is determined. Each value in the first set of values is normalized. A first weighting factor is selected based on a number of values in the first set. The embodiment also includes generating a first and a second boundary value as a function of the weighting factor, the first set normalized values and the group value of the first set and applying the first and second boundary values to control the semiconductor fabrication process.

Another embodiment provides a computer readable storage medium having instructions stored tangibly thereon, the instructions when executed by a processor cause the processor to perform operations including selecting a first parameter for monitoring during a semiconductor fabrication process. The operations also include receiving a first set of values for the first parameter, determining a group value of the first set and normalizing each value in the first set of values. The operations further include selecting a first weighting factor based on a number of values in the first set, generating a first and a second boundary value as a function of the weighting factor, the first set normalized values and the group value of the first set, and applying the first and second boundary values to control the semiconductor fabrication process.

A further embodiment provides a system for automatically calculating boundaries for a semiconductor fabrication process including a monitoring device to monitor a selected first parameter. A data determining device is included in the embodiment of the system to determine a group value of a first set of values for the first parameter. The embodiment also includes a data normalizer to normalize each value in the first set of values and a counter to determine a number of values in the first set. A generator is included to generate a first and a second boundary value as a function of a selected first weighting factor, the first set normalized values and the group value of the first set. The embodiment further includes an interface to apply the first and second boundary values to a controller to control performance of at least a portion of the semiconductor fabrication process.

While various embodiments have been described, it is to be understood that the embodiments described are illustrative only and that the scope of the subject matter is to be accorded a full range of equivalents, many variations and modifications naturally occurring to those of skill in the art from a perusal hereof.

What we claim is:

1. A method of automatically calculating boundaries for a semiconductor fabrication process, comprising:
   selecting a first parameter for monitoring during a semiconductor fabrication process;
   receiving a first set of values for the first parameter;
   determining an average value for the values in the first set;
   normalizing each value in the first set of values;
   selecting a first weighting factor based on a number of values in the first set;

generating a first and a second boundary value by computing:

$$\sigma_L = \sqrt{((\sigma_{L\_normalized})^2 + (\sigma_{element\_mean})^2)},$$

wherein $\sigma_L$ denotes an overall standard deviation for the values in the first set, $\sigma_{L\_normalized}$ denotes the standard deviation of the normalized values in the first set, $\sigma_{element\_mean}$ denotes the standard deviation of the average value for the values in the first set; and
- applying the first and second boundary values to control the semiconductor fabrication process.

2. The method of claim 1, further comprising:
- determining the standard deviation of the normalized values in the first set; and
- determining an overall standard deviation for the values in the first set.

3. The method of claim 1, wherein the first parameter comprises an active parameter.

4. The method of claim 1, wherein the step of normalizing each value in the first set of values further comprises:
- determining an offset to zero the average value of the first set; and
- adjusting each value in the first set of values based on the offset.

5. The method of claim 4, further comprising:
- selecting the first parameter for monitoring in an element from the group consisting of a device, a component, a machine, a subsystem and a system;
- receiving the first set of values for the first parameter in the element; and
- applying the first and second boundary values to control the semiconductor fabrication process in the element.

6. The method of claim 1, wherein the step of generating the first and second boundary values further comprises:
- multiplying the first weighting factor by the overall standard deviation for the first set values; and
- generating the first and second boundary values as a function of the result of the multiplying step and the average value of the first set.

7. The method of claim 6, wherein the number of values in the first set comprises a number from 10 to 19, or a number from 20 to 29, or a number at least 30.

8. The method of claim 7, wherein the first weighting factor is 6 if the number of values in the first set comprises a number from 10 to 19, the first weighting factor is 5 if the number of values in the first set comprises a number from 20 to 29, and the first weighting factor is 4 if the number of values in the first set comprises a number at least 30.

9. The method of claim 1, further comprising:
- receiving a second set of values for the first parameter in a process chamber;
- determining a group value of the second set;
- selecting a second weighting factor based on a number of values in the second set;
- generating a third and a fourth boundary value as a function of the second weighting factor, the second set of values and the group value of the second set; and
- applying the third and fourth boundary values to control the semiconductor fabrication process in the process chamber.

10. The method of claim 9, wherein the number of values in the second set is at least 30 and the second weighting factor is 4.

11. The method of claim 1, further comprising:
- selecting a second parameter for monitoring during the semiconductor fabrication process;
- receiving a first set of values for the second parameter;
- determining a target value for the first set of second parameter values;
- normalizing each value in the first set of second parameter values;
- selecting the first weighting factor based on a number of values in the first set of second parameter values;
- generating a third and a fourth boundary value as a function of the first weighting factor, the normalized values in the first set of second parameter values and the target value for the first set of second parameter values; and
- applying the third and fourth boundary values to control the semiconductor fabrication process.

12. The method of claim 11, wherein the second parameter comprises a passive parameter.

13. The method of claim 1, further comprising:
- determining a minimum and a maximum boundary value for the first parameter; and
- applying the first and second boundary values to control the semiconductor fabrication process only if the first and second boundary values are less than the maximum boundary value and more than the minimum boundary value.

14. The method of claim 1, wherein the first parameter is a single parameter.

15. A non-transitory computer readable storage medium having instructions stored tangibly thereon, the instructions when executed by a processor causing the processor to perform the operations of:
- selecting a first parameter for monitoring during a semiconductor fabrication process;
- receiving a first set of values for the first parameter;
- determining a group value of the first set;
- normalizing each value in the first set of values by determining an offset to zero the group value of the first set of values and adjusting each value in the first set of values based on the offset;
- selecting a first weighting factor based on a number of values in the first set;
- generating a first and a second boundary value as a function of the weighting factor, the first set normalized values and the group value of the first set; and
- applying the first and second boundary values to control the semiconductor fabrication process.

16. The non-transitory computer readable storage medium of claim 15, wherein the instructions when executed by the processor cause the processor to further perform the operations of:
- selecting a second parameter for monitoring during the semiconductor fabrication process;
- receiving a first set of values for the second parameter;
- determining a target value for the first set of second parameter values;
- normalizing each value in the first set of second parameter values;
- selecting the first weighting factor based on number of values in the first set of second parameter values;
- generating a third and a fourth boundary value as a function of the first weighting factor, the normalized values in the first set of second parameter values and the target value for the first set of second parameter values; and
- applying the third and fourth boundary values to control the semiconductor fabrication process.

17. The non-transitory computer readable storage medium of claim 16, wherein the first parameter comprises an active parameter and the second parameter comprises a passive parameter.

18. The non-transitory computer readable storage medium of claim 15, wherein the instructions when executed by the processor cause the processor to further perform the operations of:

receiving a second set of values for the first parameter in an element from the group consisting of a device, a component, a machine, a subsystems and a system;

determining a group value of the second set;

selecting a second weighting factor based on a number of values in the second set;

generating a third and a fourth boundary value as a function of the second weighting factor, the second set values and the group value of the second set; and applying the third and fourth boundary values to control the semiconductor fabrication process in the element.

19. The non-transitory computer readable storage medium of claim 15, wherein the group value is an average value of the values in the first set, and wherein the instructions when executed by the processor cause the processor to further perform the operations of:

generating the first and the second boundary value by computing:

$$\sigma_L = \sqrt{(\sigma_{L\_normalized})^2 + (\sigma_{element\_mean})^2},$$

wherein $\sigma_L$ denotes an overall standard deviation for the values in the first set, $\sigma_{L\_normalized}$ denotes the standard deviation of the normalized values in the first set, and $\sigma_{element\_mean}$ denotes the standard deviation of the average value for the values in the first set.

20. A system for automatically calculating boundaries for a semiconductor fabrication process, comprising:

a monitoring device to monitor a selected first parameter during a semiconductor fabrication process;

a data determining device to determine a group value of a first set of values for the first parameter;

a data normalizer to normalize each value in the first set of values by determining an offset to zero the group value of the first set of values and adjusting each value in the first set of values based on the offset;

a counter to determine a number of values in the first set;

a generator to generate a first and a second boundary value as a function of a selected first weighting factor, the first set normalized values and the group value of the first set; and an interface to apply the first and second boundary values to a controller to control performance of at least a portion of the semiconductor fabrication process.

* * * * *